United States Patent [19]

Hayashida et al.

[11] Patent Number: 5,335,259

[45] Date of Patent: Aug. 2, 1994

[54] X-RAY EXPOSURE APPARATUS

[75] Inventors: Masami Hayashida, Yokohama; Yasuaki Fukuda, Hadano; Yutaka Watanabe, Isehara, all of Japan

[73] Assignee: Canon Kabushiki Kaisha, Tokyo, Japan

[21] Appl. No.: 15,434

[22] Filed: Feb. 9, 1993

[30] Foreign Application Priority Data

Feb. 10, 1992 [JP] Japan .................................. 4-057463
Dec. 25, 1992 [JP] Japan .................................. 4-359605

[51] Int. Cl.$^5$ .......................................... G21K 1/00
[52] U.S. Cl. ................................. 378/161; 378/34; 378/145; 378/159
[58] Field of Search .............. 378/161, 34, 140, 145, 378/156, 159

[56] References Cited

U.S. PATENT DOCUMENTS

| | | | |
|---|---|---|---|
| 5,123,036 | 6/1992 | Uno et al. ............................. | 378/34 |
| 5,125,014 | 6/1992 | Watanabe et al. .................... | 378/34 |
| 5,134,640 | 7/1992 | Hirokawa et al. ............... | 378/161 X |
| 5,172,402 | 12/1992 | Mizusawa et al. .................... | 378/34 |
| 5,204,886 | 4/1993 | Dugdale ................................ | 378/34 |

*Primary Examiner*—David P. Porta
*Attorney, Agent, or Firm*—Fitzpatrick, Cella, Harper & Scinto

[57] ABSTRACT

An X-ray apparatus includes an X-ray pickup window through which synchrotron radiation light is projected, the X-ray pickup window having an X-ray transmission film; and a correcting system for correcting an intensity distribution of the synchrotron radiation light; wherein the X-ray transmission film has at least one of a film thickness distribution and a transmissivity distribution changing substantially in a predetermined direction; and wherein the X-ray transmission film is so disposed that the predetermined direction is substantially aligned with the direction of change of the intensity distribution of the synchrotron radiation light.

16 Claims, 8 Drawing Sheets

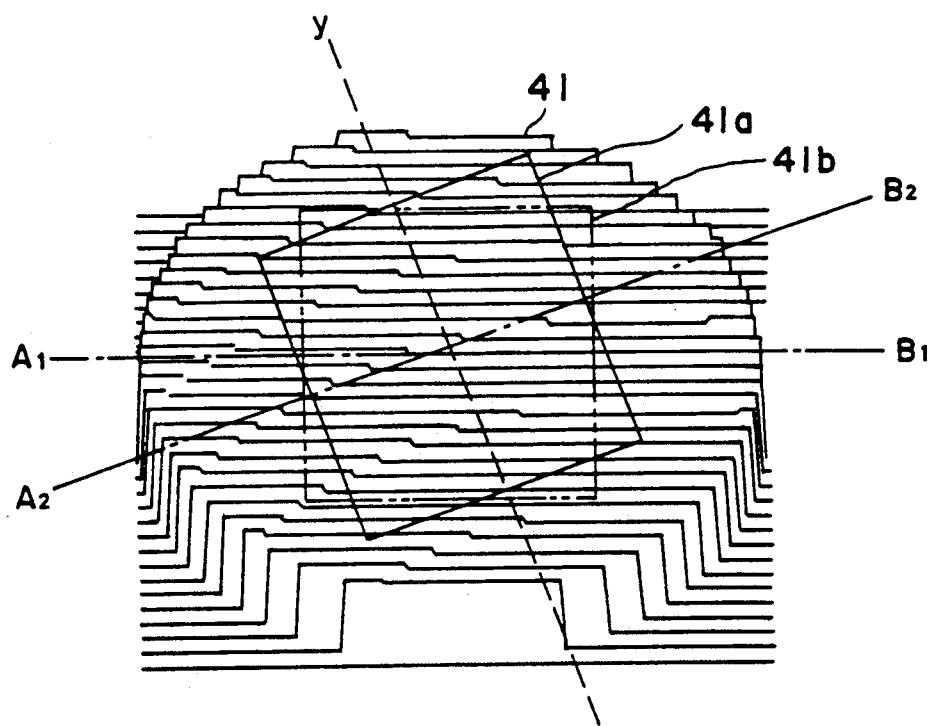
F I G. 4
$I_1 = I_2 = I_3$
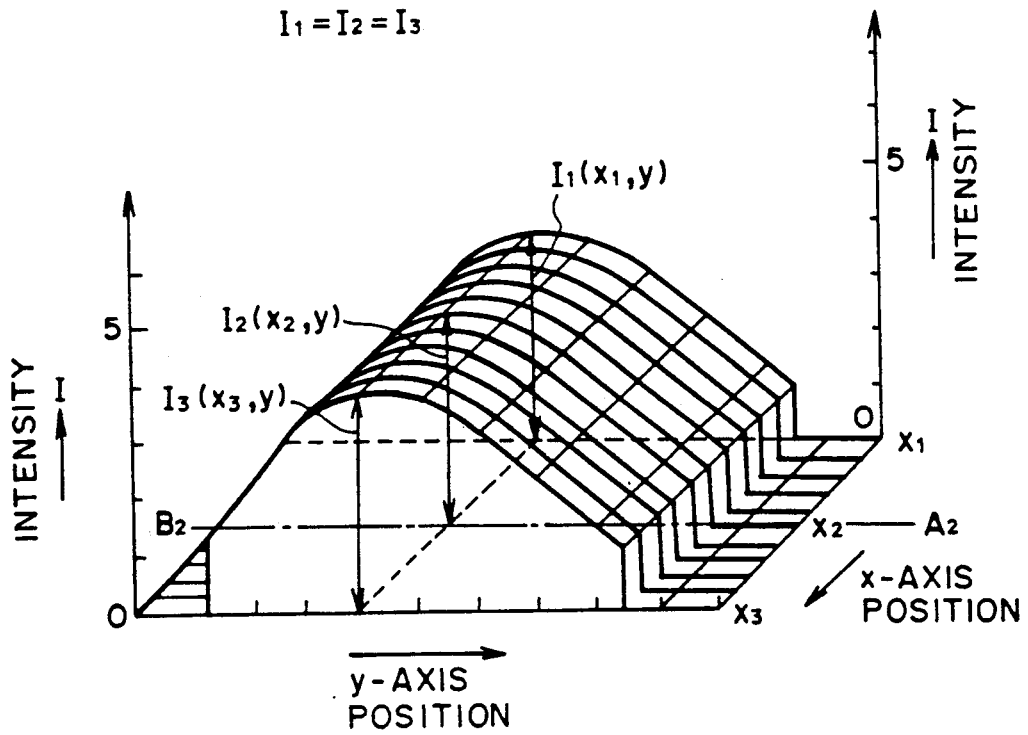
F I G. 5

X-RAY EXPOSURE APPARATUS

FIELD OF THE INVENTION AND RELATED ART

This invention relates to an X-ray exposure apparatus which uses synchrotron radiation light as illumination light.

Development of such semiconductor device manufacturing exposure apparatuses of the type that use synchrotron radiation light has advanced. Generally, the synchrotron radiation X-rays have a small divergence angle with respect to the direction (y-axis direction) perpendicular to the orbit plane of a charged particle accumulation ring (light source). To compensate for this, some measures may be required: for example, placing a swingable or fixed convex mirror on the path of light from the light source to a substrate such as a wafer to thereby expand the divergence angle with respect to the y-axis direction.

The synchrotron radiation X-rays as expanded by such a mirror in the y-axis direction have an intensity distribution which is uniform in the direction (x-axis direction) perpendicular to the y-axis direction, but which is uneven in the y-axis direction. To compensate for this, it may be necessary to provide a shutter between the mirror and the substrate and to control the moving speed of the shutter. Alternatively, it may be necessary to control the scanning speed of a mask stage or a wafer stage. By these measures, non-uniformness of exposure amount due to the distribution of X-ray intensity may be corrected and non-uniform exposure of the substrate may be prevented.

On the other hand, the substrate is placed in a reduced pressure chamber having a reduced pressure ambience of helium gas, for example. The synchrotron radiation X-rays expanded by the mirror go through a beam duct which is maintained under a vacuum of about $10^{-9}$ and, after passing through an X-ray transmission film such as a beryllium thin film, enter the reduced pressure chamber.

The amount of X-ray absorption by such an X-ray transmission film is uneven due to non-uniformness in thickness of the film, for example. This causes non-uniform exposure of a substrate. When the tolerance of linewidth error for a fine pattern to be printed by exposure is ±2.5%, such non-uniform exposure resulting from the X-ray transmission film should desirably be not more than 1% (while taking into account the non-uniformness in exposure to be caused by a mask, for example, which is also to be irradiated). However, it has been found that, in a case when a beryllium film is used as the X-ray transmission film and when the center wavelength of the synchrotron radiation X-rays expanded by a mirror is 10 angstroms non-uniform exposure of 1% can be caused by even a very small non-uniformness in thickness of about 0.3 micron of the beryllium film. It is however very difficult to reduce the non-uniformness in thickness of the X-ray transmission film such as a beryllium film, to the very small amount as above.

As an example, generally a beryllium film can be produced by a rolling method or a vacuum deposition method. With the rolling method, non-uniformness thickness easily occurs in a stripe-like fashion in the rolling direction. As a result, the thickness distribution has an approximately one-dimensional shape, in the direction perpendicular to the rolling direction.

With the vacuum deposition method, while the non-uniformness is not as large as by the rolling method, there easily occurs non-uniformness of in thickness due to a vacuum deposition device or during the rolling operation to be executed after the deposition. In many cases, such non-uniformness also appears in a one-dimensional distribution. Usually, a beryllium film of a thickness of 20 microns has a non-uniformness in thickness of about 2-5 microns. Thus, the non-uniformness of exposure resulting from this largely exceeds the aforementioned tolerance.

SUMMARY OF THE INVENTION

It is accordingly an object of the present invention to provide an improved X-ray exposure apparatus by which non-uniform exposure due to such non-uniform thickness of an X-ray transmission film may be reduced considerably.

It is another object of the present invention to provide an improved semiconductor device manufacturing method by which non-uniformness in exposure can be reduced and by which semiconductor devices of a higher degree of integration can be manufactured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view, illustrating a thickness distribution of a beryllium film and an X-ray pickup area to be defined on the film.

FIG. 5 is a graph of an intensity distribution of synchrotron radiation X-rays in a case when the X-ray pickup area 41a shown in FIG. 4 is used as a "beryllium film".

DESCRIPTION OF THE PREFERRED EMBODIMENTS

Figure 1:
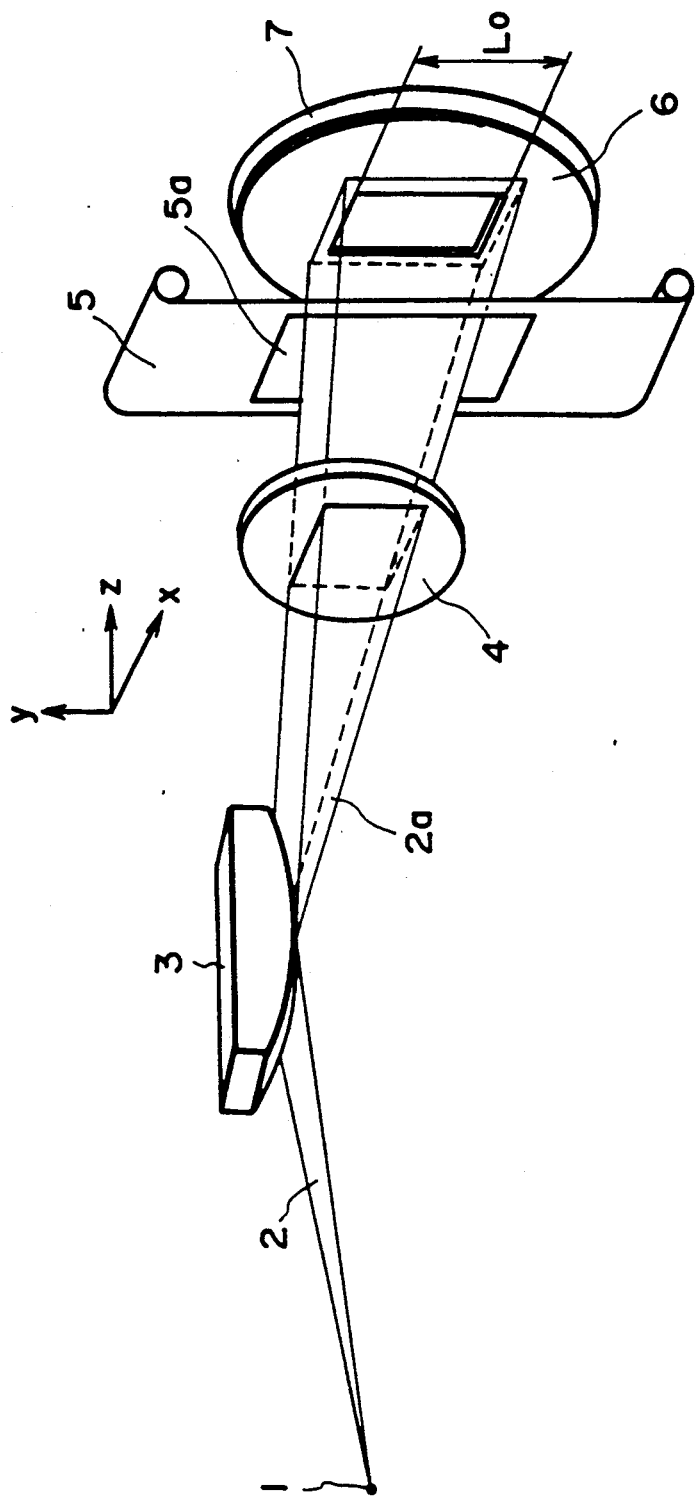
FIG. 1 is a schematic view of an embodiment of the present invention.

FIG. 1 shows an embodiment of the present invention which is applied to an X-ray exposure apparatus. Synchrotron radiation light (X-ray) 2 emitted from the emission point 1 of a charged particle accumulation ring is expanded by a fixed mirror 3 having a convex reflection surface, in a direction (y-axis direction) perpendicular to the orbit plane of the accumulation ring. After passing through an X-ray pickup window having a beryllium film (X-ray transmission film) 4, it is introduced into a reduced pressure chamber (not shown) having a reduced pressure ambience of helium gas. Then, it passes an aperture 5a of a shutter and impinges on a mask 6, whereby a mask pattern of the mask 6 is printed on a wafer (substrate) 7.

Figure 2:
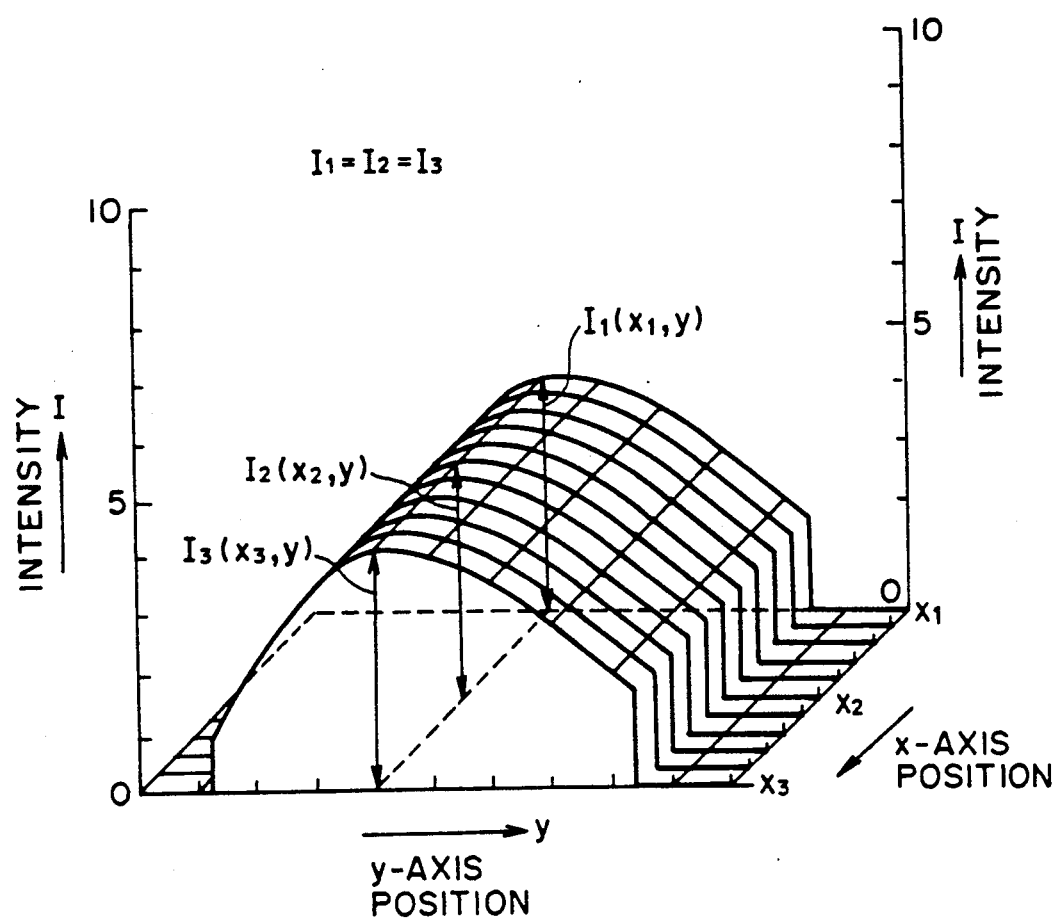
FIG. 2 is a graph of an intensity distribution of expanded synchrotron radiation X-rays.

The synchrotron radiation X-rays 2a expanded in the y-axis direction by the mirror 3 have an intensity distribution such as shown in FIG. 2. That is, it is even in a direction (x-axis direction) perpendicular to the y-axis direction, but in the y-axis direction it has a distribution with a peak at its central portion.

Figure 3:
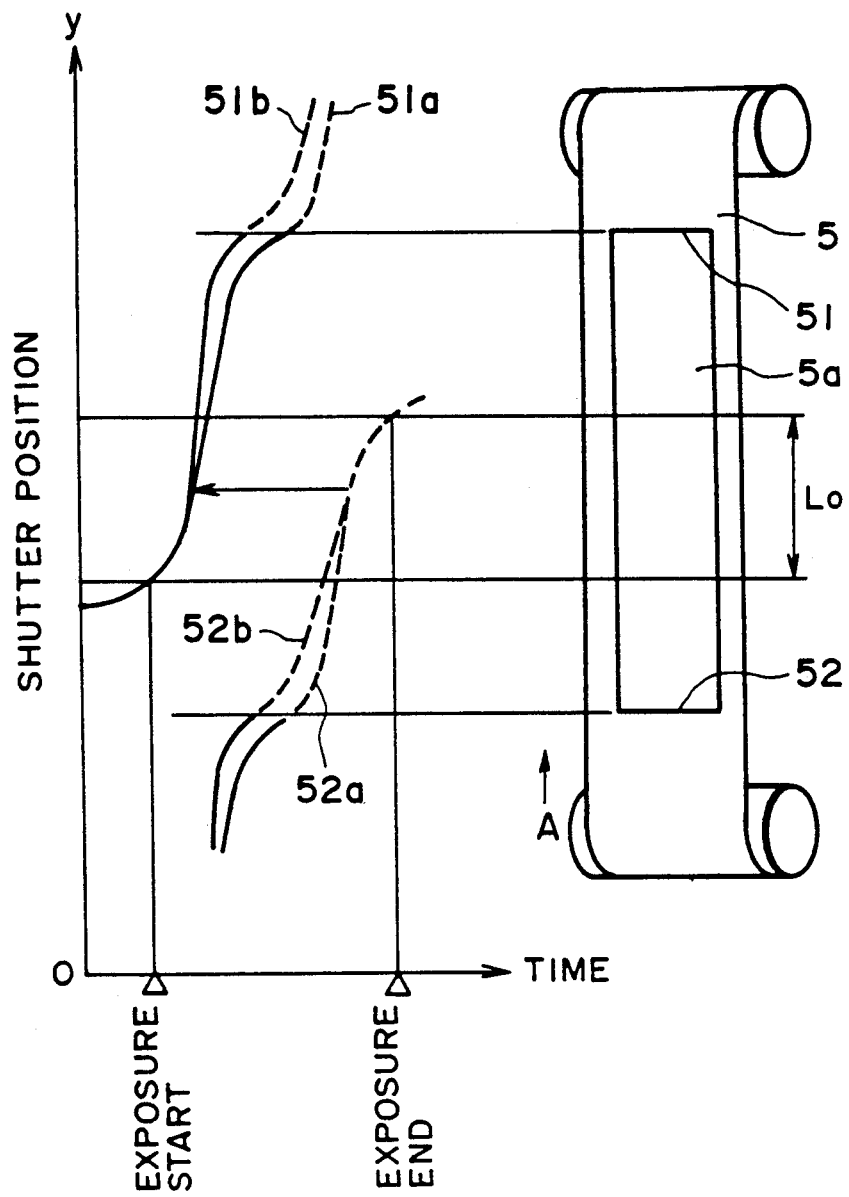
FIG. 3 is a graph of a displacement curve of a shutter.

In order to avoid non-uniform exposure of the wafer 7 resulting from such an intensity distribution, the movement of the shutter 5 is controlled in accordance with displacement curves shown in FIG. 3. FIG. 3 illustrates the y-axis positions of the upper edge (hereinafter "leading shutter") 51 and the lower edge (hereinafter "trailing shutter") 52 of the aperture 5a as the shutter 5 moves in the y-axis direction as depicted by an arrow, in relation to the time period from start to end of the exposure operation. Displacement of the leading shutter 51 is depicted by displacement curve 51a, while displacement of the trailing shutter 52 is depicted by displacement curve 52a.

The amount of exposure at a given position within a width $L_0$, in the y-axis direction, of the exposure region of the wafer 7 is determined by the product of the exposure period $\Delta t$, from the moment when the opening 5a of the shutter is opened with the leading shutter 51 to the moment when the opening is closed with the trailing shutter 52, with the intensity of synchrotron radiation X-rays at that position. Thus, by changing the exposure period $\Delta t$ in accordance with the intensity distribution, it is possible to cancel the non-uniformness of exposure.

Since, however, as the expanded synchrotron radiation X-rays 2a pass through the beryllium film 4, the intensity distribution changes due to non-uniform X-ray absorption resulting from non-uniform thickness of the film 4, and there is still a possibility of non-uniform exposure. In consideration of this, an appropriate direction of thickness change is selected in the distribution of non-uniformness in thickness of the beryllium film 4, and the film is so disposed that the selected direction is aligned with the y-axis direction. Further, the displacement curve of the shutter is so modified as to compensate for the non-uniformness in thickness concurrently.

As an example, when a beryllium film 41 of a thickness of 25 microns having a substantially one-dimensional distribution such as shown in FIG. 4 is used, it may be so placed that the direction (direction of center line $A_2$–$B_2$) in which the thickness substantially is unchanged, is aligned with the x-axis direction and that the area as depicted by solid line 41a is used as the X-ray pickup portion.

The synchrotron radiation X-rays passed through such a beryllium film 4 having a thickness distribution as described above, have an intensity distribution as illustrated in FIG. 5 which is substantially even in the x-axis direction and which changes only in the y-axis direction. Thus, by correcting the displacement curves 51a and 52a of the shutter 5 on the basis of the intensity distribution of FIG. 5 and by controlling the movement of the shutter 5 in accordance with corrected displacement curves 51b and 52b (see FIG. 3), it is possible to reduce non-uniform exposure due to non-uniform thickness of the beryllium film 4, considerably.

It has been confirmed that the non-uniform exposure of the wafer 7 due to non-uniform thickness of the beryllium film 4 can be reduced to about 0.5%, by controlling the movement of the shutter 5 in accordance with the thus corrected displacement curves 51b and 52b.

Figure 6:
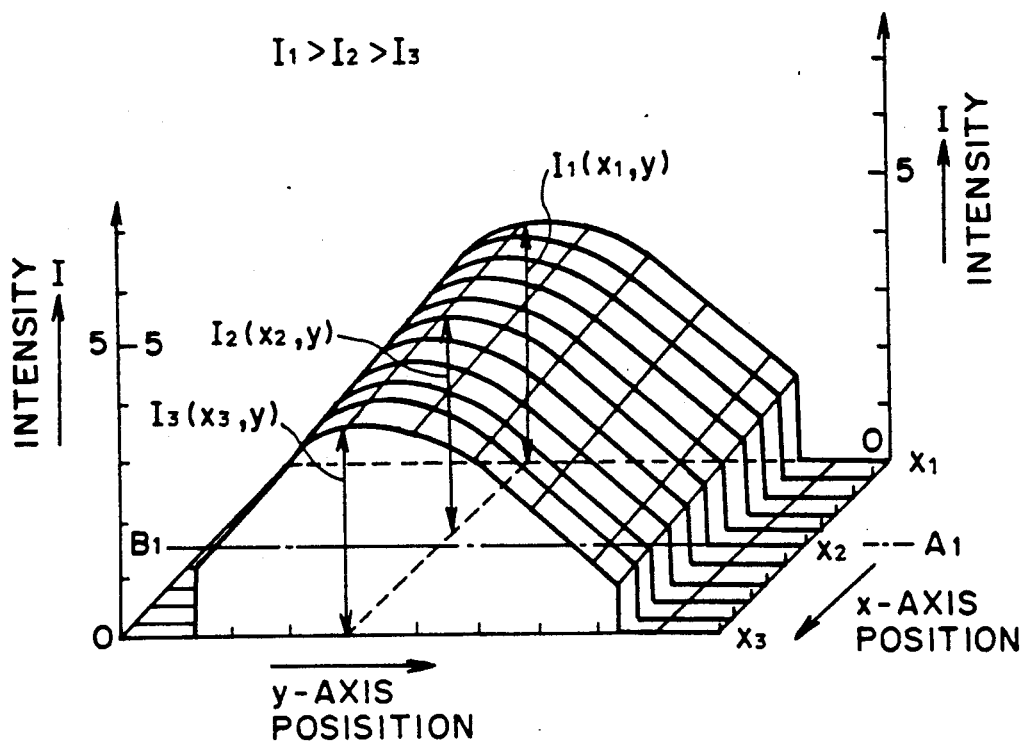
FIG. 6 is a graph of an intensity distribution of synchrotron radiation X-rays in a case when the X-ray pickup area 41b shown in FIG. 4 is used as a "beryllium film".

When as a comparative example the beryllium film 41 as aforementioned is disposed so that the center line $A_1$–$B_1$ is aligned with the x axis and that the area as depicted by a broken line 41b is used as the X-ray pickup portion, the synchrotron radiation X-rays passed through the beryllium film have an intensity distribution as shown in FIG. 6 which is uneven in the x-axis direction. Thus, a non-uniformness of wafer exposure of about 10.4% results from the non-uniform thickness of the beryllium film. It has been confirmed that, even if the displacement curves of the shutter are corrected while taking into account the non-uniformness in thickness of the beryllium film, non-uniformness of exposure of about 8.1% remains.

The direction of substantially one-dimensional thickness distribution of the beryllium film 41 may be detected in the manner to be described below.

Figure 7:
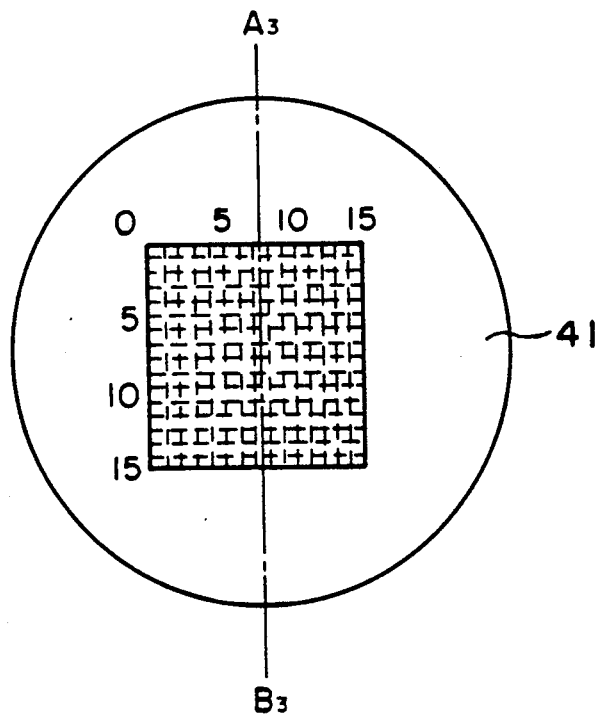
FIG. 7 is a schematic view for explaining the manner of measuring the thickness distribution of a beryllium film.

As shown in FIG. 7, an X-ray pickup area may be defined provisionally on the beryllium film 41. Then, the area may be divided regularly by sixteen dividing lines along the center line $A_3$–$B_3$ and by fifteen dividing lines along a direction perpendicular to the center line. At each intersection of such dividing lines, the thickness of the beryllium film 41 may be measured, by which the thickness distribution of the beryllium film 41 may be determined. From the thus obtained thickness distribution, an average of measured values of thickness along each row extending perpendicularly to the center line $A_3$–$B_3$ may be determined by calculation, by which the thickness distribution along the center line $A_3$–$B_3$ is determined.

Thereafter, with regard to each of the different straight lines each intersecting the center line $A_3$–$B_3$ at a predetermined angle, an X-ray pickup area may be defined provisionally and an average of measured values of film thickness may be determined by calculation, by which film thickness distributions with respect to different directions intersecting the center line $A_3$–$B_3$ are determined. Among these directions, such a one as having a largest film thickness distribution may be selected.

Then, the beryllium film may be disposed in that direction and the displacement curves of the shutter may be corrected in accordance with the average film thickness distribution along the center line.

Figure 8:
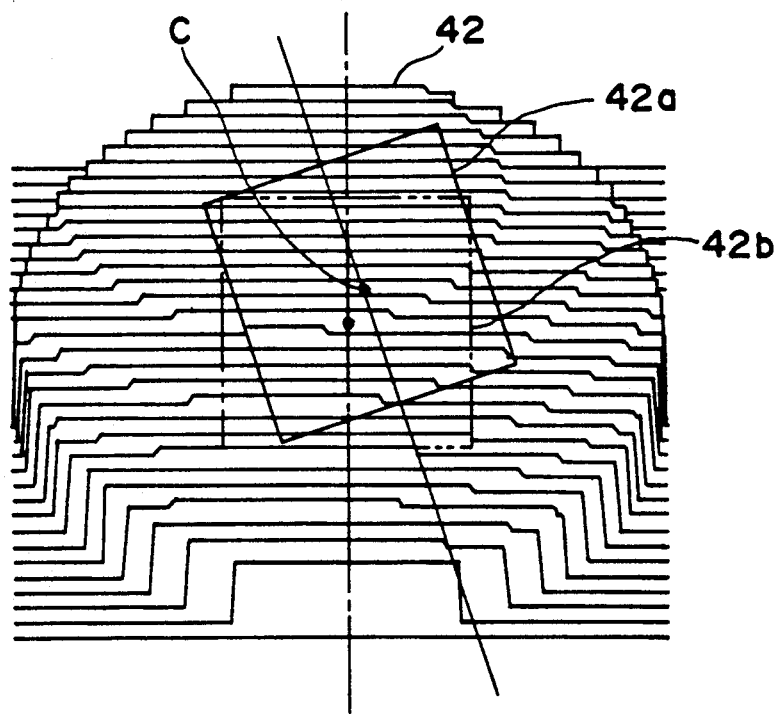
FIG. 8 is a schematic view for explaining the manner of determining the X-ray pickup area in a case when an X-ray transmission film is sufficiently large as compared with the X-ray pickup area.

Also, when an X-ray transmission film has a two-dimensional non-uniformness of thickness such as shown in FIG. 8, film thickness distributions may be measured in accordance with the method described above, and such a direction as having a smallest dispersion of non-uniformness of film thickness in rows intersecting the center line may be selected as the direction of disposition of the X-ray transmission film. Further, when an X-ray transmission film is so large as compared with the X-ray pickup portion that the center line C of the X-ray pickup portion can be set off the center of the X-ray transmission film, some arrangements in which the center C is shifted or deviated in different directions, within an admittable range, may be considered provisionally and the film thickness distributions of corresponding X-ray pickup areas 42a, 42b, etc., may be measured. Then, the X-ray transmission film may be disposed so that, among all the measured film thickness distributions, the portion as having the smallest dispersion of film thickness distributions is in the rows which intersect the center line perpendicularly.

Figure 9:
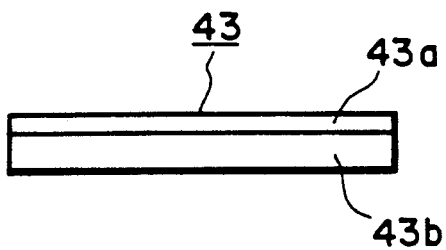
FIG. 9 is a schematic view of a laminated film structure.

Furthermore, when an X-ray transmission film comprises a laminated film 43 such as shown in FIG. 9 wherein it has a layered structure of thin film layers 43a and 43b of a beryllium film and a polyimide film, the X-ray transmissivity of the laminated thin film may be measured directly. Subsequently, on the basis of this and in a similar manner as described, the direction and position of maximum non-uniformness of X-ray transmissivity or, alternatively, those of small dispersion of film thickness distributions of the rows intersecting the center line perpendicularly, may be determined. Then, the X-ray transmission film may be so disposed that the determined direction is aligned with the x-axis direction, and it may be used as the X-ray pickup window.

The direction of disposition of a beryllium film may be determined by measuring the X-ray transmissivity distribution of the film. On that occasion, in place of measuring the film thickness as described, the X-ray transmissivity of the beryllium film may be measured and such a direction as having a largest distribution of X-ray transmissivity change may be determined. Then, the beryllium film may be disposed along the thus determined direction.

If some mark or feature for identification of the direction or position for the disposition of the film is provided on the X-ray transmission film itself or on a holder for supporting the film, then the mounting of the X-ray transmission film is facilitated significantly. Also, when a rotating or moving mechanism is added to the X-ray transmission film or to a holder supporting the film, it is very easy to correctly dispose the same without demounting the film. Particularly, in a case when an X-ray detector is provided on a mask stage or a wafer stage, the intensity distribution of the X-rays passed through the transmission film may be measured by such an X-ray detector and, on the basis of the measurement, the X-ray transmission film may be rotated or moved by the rotating or moving mechanism to an appropriate position.

While in the above-described embodiment the moving speed of the shutter is controlled to attain uniform exposure on different portions of the wafer some other structures may be adopted. For example, the mask 6 and the wafer 7 may be moved as a unit so that they may be scanned with the synchrotron radiation X-rays. By controlling the scanning speed, the amount of exposure on different portions of the wafer can be made uniform. Alternatively, the mirror 3 may be made swingable, and the swinging speed may be adjusted to adjust the amount of exposure on different portions of the wafer.

While in the foregoing the invention has been described with reference to an X-ray exposure apparatus, the invention is not limited to this but it is applicable also to an apparatus, such as an X-ray CVD apparatus, for example, wherein an X-ray transmission film is used and wherein uniform illumination is required.

Now, an embodiment of a semiconductor device manufacturing method according to the present invention which uses an exposure apparatus as having been described in the foregoing, will be explained.

Figure 10:
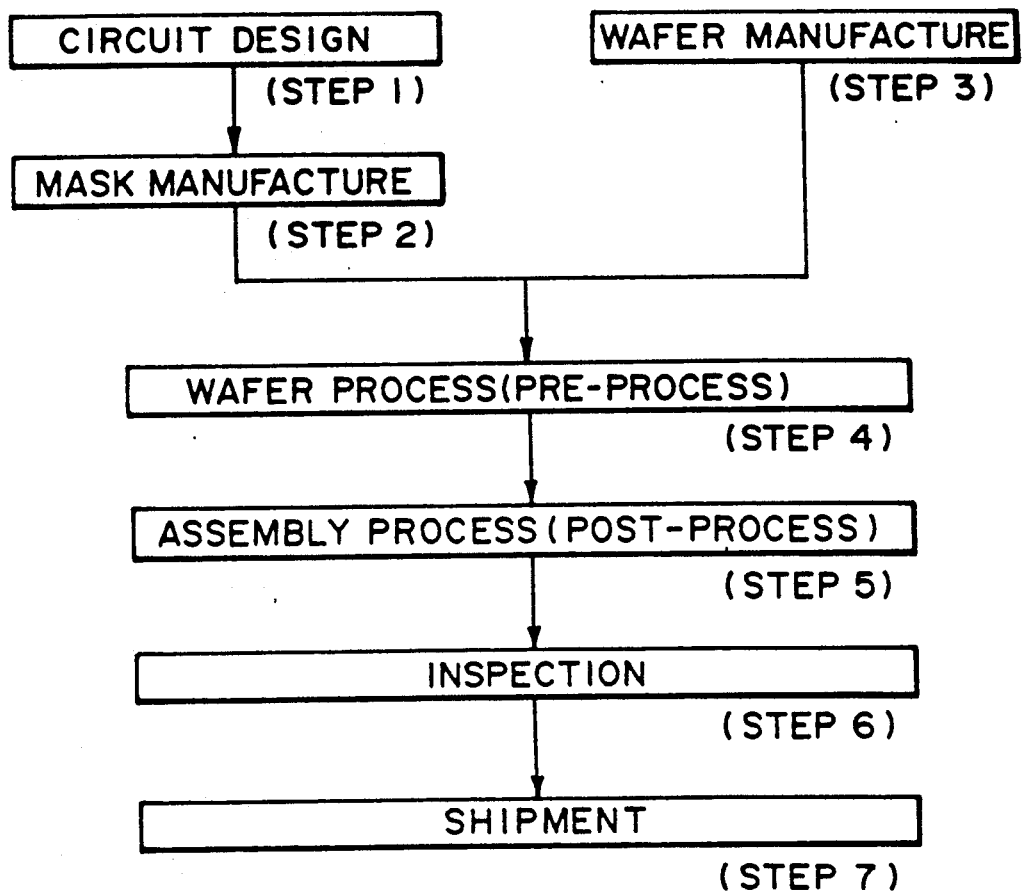
FIG. 10 is a flow chart for explaining semiconductor device manufacturing processes.

FIG. 10 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 11:
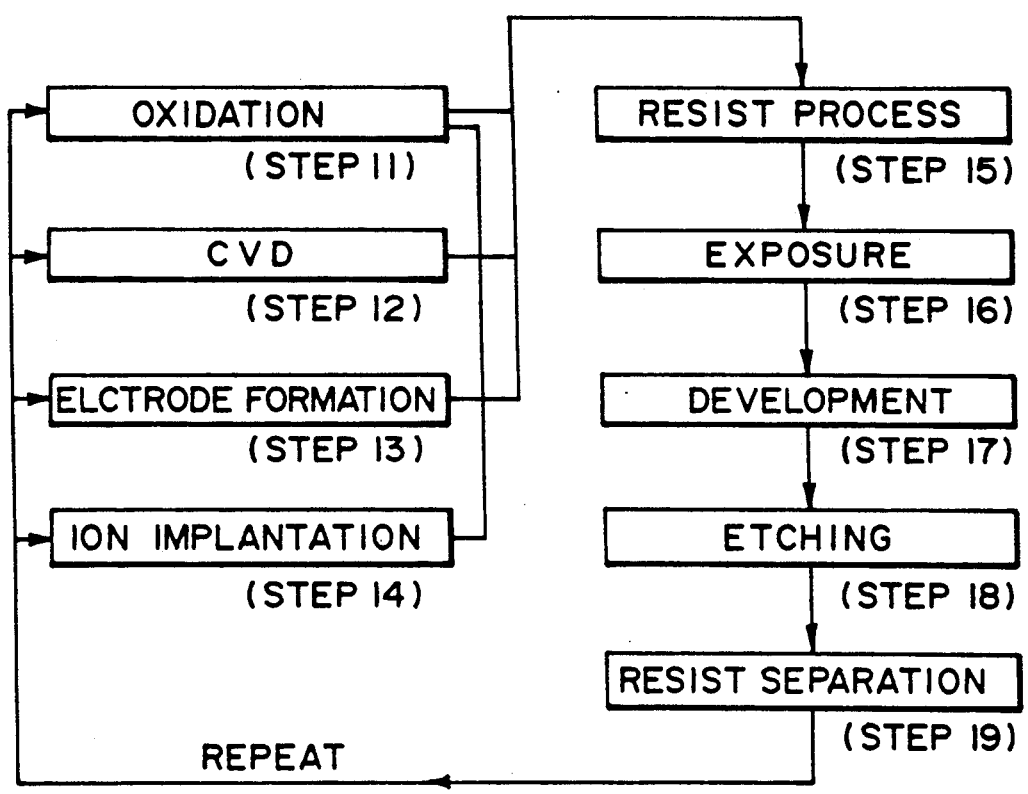
FIG. 11 is a flow chart for explaining details of a wafer process.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An x-ray apparatus, comprising:
   an X-ray window through which synchrotron radiation light is projected, said X-ray window having an X-ray transmission film; and
   correcting means for correcting an intensity distribution of the synchrotron radiation light,
   wherein said X-ray transmission film has at least one of a film thickness distribution and a transmissivity distribution changing substantially in a predetermined direction and said X-ray transmission film is so disposed that the predetermined direction is substantially aligned with a direction of change of the intensity distribution of the synchrotron radiation light.

2. An apparatus according to claim 1, wherein one of the film thickness distribution and the transmissivity distribution of said X-ray transmission film changes substantially one-dimensionally.

3. An apparatus according to claim 1, wherein said X-ray transmission film has a layered structure.

4. An x-ray exposure apparatus, comprising:
   holding means for holding a substrate to be exposed;

an X-ray window through which synchrotron radiation light is projected, said X-ray window having an X-ray transmission film; and correcting means for correcting an intensity distribution of the synchrotron radiation light, wherein said X-ray transmission film has at least one of a film thickness distribution and a transmissivity distribution changing substantially in a predetermined direction and said X-ray transmission film is so disposed that the predetermined direction is substantially aligned with a direction of change of the intensity distribution of the synchrotron radiation light.

5. An apparatus according to claim 4, wherein said correcting means comprises a shutter for blocking the synchrotron radiation light and wherein said correcting means corrects the intensity distribution by controlling an exposure time of a portion of the substrate with said shutter.

6. An apparatus according to claim 4, wherein said correcting means scans the substrate with the synchrotron radiation light, and corrects the intensity distribution by controlling the scanning speed to control the exposure time at each portion of the substrate.

7. An apparatus according to claim 4, wherein said correcting means comprises a scanning mirror for reflecting the synchrotron radiation light and wherein said correcting means corrects the intensity distribution by scanning said mirror with a controlled scanning speed to control the exposure time at each portion of the substrate.

8. A method of manufacturing a semiconductor device with X-ray exposure, comprising the steps of:
holding a mask having a pattern and a wafer to be exposed to the pattern of the mask;
projecting synchrotron radiation light through an X-ray window having an X-ray transmission film, wherein the X-ray transmission film has at least one of a film thickness distribution and a transmissivity distribution changing substantially in a predetermined direction, and the X-ray transmission film is so disposed that the predetermined direction is substantially aligned with a direction of change of the intensity distribution of the synchrotron radiation light; correcting the intensity distribution of the synchrotron radiation light; and
transferring the pattern of the mask to the wafer with the synchrotron radiation light.

9. An X-ray apparatus, comprising:
an X-ray window through which synchrotron radiation light is projected, said X-ray window having an X-ray transmission film; and
correcting means for correcting an intensity distribution of the synchrotron radiation light,
wherein said X-ray transmission film has at least one of a film thickness distribution and a transmissivity distribution changing substantially in a predetermined direction and said X-ray transmission film is so disposed that the predetermined direction is substantially aligned with a direction of correction of the intensity distribution.

10. An apparatus according to claim 9, wherein of the film thickness distribution and the transmissivity distribution of said X-ray transmission film changes substantially one-dimensionally.

11. An apparatus according to claim 9, wherein said X-ray transmission film has a layered structure.

12. An X-ray exposure apparatus, comprising:
holding means for holding a substrate to be exposed;
an X-ray window through which synchrotron radiation light is projected, said X-ray window having an X-ray transmission film; and
correcting means for correcting an intensity distribution of the synchrotron radiation light,
wherein said X-ray transmission film has at least one of a film thickness distribution and a transmissivity distribution changing substantially in a specified direction and said X-ray transmission film is so disposed that the specified direction is substantially aligned with a direction of correction of the intensity distribution.

13. An apparatus according to claim 12, wherein said correcting means comprises a shutter for blocking the synchrotron radiation light and wherein said correcting means corrects the intensity distribution by controlling exposure time at each portion of the substrate with said shutter.

14. An apparatus according to claim 12, wherein said correcting means scans the substrate with the synchrotron radiation light, and corrects the intensity distribution by controlling the scanning speed to control the exposure time at each portion of the substrate.

15. An apparatus according to claim 12, wherein said correcting means comprises a scanning mirror for reflecting the synchrotron radiation light and wherein said correcting means corrects the intensity distribution by scanning said mirror with a controlled scanning speed to control the exposure time at each portion of the substrate.

16. A method of manufacturing a semiconductor device with X-ray exposure, comprising the steps of:
holding a mask having a pattern and a wafer to be exposed to the pattern of the mask;
projecting synchrotron radiation light through an X-ray window having an X-ray transmission film, wherein the X-ray transmission film has at least one of a film thickness distribution and a transmissivity distribution changing substantially in a predetermined direction;
correcting the intensity distribution of the synchrotron radiation light along the predetermined direction of the X-ray transmission film; and
transferring the pattern of the mask to the wafer with the synchrotron radiation light.

* * * * *

UNITED STATES PATENT AND TRADEMARK OFFICE
CERTIFICATE OF CORRECTION

PATENT NO. : 5,335,259
DATED : August 2, 1994
INVENTOR(S) : Masami HAYASHIDA, et al.

It is certified that error appears in the above-indentified patent and that said Letters Patent is hereby corrected as shown below:

COLUMN 1:

Line 56, "angstroms" should read --angstroms,--.

COLUMN 2:

Line 5, "of" should be deleted.

COLUMN 6:

Line 46, "x-ray" should read --X-ray--; and
Line 67, "x-ray" should read --X-ray--.

COLUMN 7:

Line 45, "tion light; correcting the intensity distribution of" should read
--tion light;
    ¶correcting the intensity distribution of--.

Signed and Sealed this

Sixth Day of December, 1994

BRUCE LEHMAN

Attest:

Attesting Officer

Commissioner of Patents and Trademarks